US010998916B2

United States Patent
Wang (10) Patent No.: US 10,998,916 B2
(45) Date of Patent: May 4, 2021

(54) SIGMA-DELTA ANALOG-TO-DIGITAL CONVERTER CAPABLE OF REDUCING IDLE TONES WHILE ALTERNATELY CONDUCTING SIGNAL CONVERSION AND COMPARATOR OFFSET CALIBRATION

(71) Applicant: REALTEK SEMICONDUCTOR CORP., Hsinchu (TW)

(72) Inventor: Chih-Chiang Wang, Hsinchu County (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/742,223

(22) Filed: Jan. 14, 2020

(65) Prior Publication Data

US 2020/0235749 A1    Jul. 23, 2020

(30) Foreign Application Priority Data

Jan. 18, 2019 (TW) .................. 108102098

(51) Int. Cl.
*H03M 3/00* (2006.01)
*H03K 5/24* (2006.01)

(52) U.S. Cl.
CPC ............ *H03M 3/384* (2013.01); *H03K 5/24* (2013.01); *H03M 3/34* (2013.01); *H03M 3/37* (2013.01); *H03M 3/424* (2013.01); *H03M 3/436* (2013.01); *H03M 3/464* (2013.01)

(58) Field of Classification Search
CPC .... H03M 3/424; H03M 1/1215; H03M 1/125; H03M 1/38; H03M 1/48; H03M 3/34; H03M 3/37; H03M 3/384; H03M 3/436; H03M 3/464; H03M 1/0607; H03M 1/1023; H03M 1/12; H03M 1/1245; H03M 1/182; H03M 1/462; H03M 3/328; H03M 3/392;
(Continued)

(56) References Cited

U.S. PATENT DOCUMENTS

6,326,911 B1  12/2001 Gomez et al.
6,459,335 B1 * 10/2002 Darmawaskita .... H03F 3/45977
                                            327/124
9,866,227 B1 *  1/2018 Bresciani ................ H03M 1/46
(Continued)

*Primary Examiner* — Linh V Nguyen
(74) *Attorney, Agent, or Firm* — Birch, Stewart, Kolasch, & Birch, LLP (57) ABSTRACT

A sigma-delta analog-to-digital converter includes: a subtractor for subtracting a feedback signal from an analog input signal; a loop filter for processing the output signal from the subtractor to generate a filtered signal; a signal comparing circuit for selectively operating in an offset detection mode or a signal comparison mode, wherein the signal comparing circuit generates an error signal irrelevant to the relative magnitude between the filtered signal and a reference signal in the offset detection mode, and generates a comparison signal corresponding to the relative magnitude between the filtered signal and the reference signal in the signal comparison mode; an offset calibration control circuit for calibrating the offset of the signal comparing circuit and for controlling the signal comparing circuit to alternately switch between the offset detection mode and the signal comparison mode; and a digital-to-analog converter for generating the feedback signal according to the comparison signal.

10 Claims, 9 Drawing Sheets

(58) Field of Classification Search
CPC ........ H03M 3/43; H03M 3/454; H03M 3/462; H03M 3/466
USPC .......................................... 341/118–121, 143
See application file for complete search history.

(56) References Cited

U.S. PATENT DOCUMENTS

| | | | |
|---|---|---|---|
| 10,819,328 B2* | 10/2020 | Zanbaghi ................ | H03K 4/066 |
| 2007/0216557 A1* | 9/2007 | Ebner .................... | H03M 3/384 |
| | | | 341/143 |
| 2011/0063146 A1* | 3/2011 | Matthews ............... | H03M 3/34 |
| | | | 341/118 |
| 2011/0163901 A1* | 7/2011 | Quiquempoix ..... | H03M 1/0665 |
| | | | 341/143 |
| 2013/0207821 A1* | 8/2013 | Sherry ................... | G06G 7/184 |
| | | | 341/143 |
| 2014/0022102 A1* | 1/2014 | Cho ....................... | H03M 3/384 |
| | | | 341/120 |
| 2014/0167995 A1* | 6/2014 | Tiew ....................... | H03M 3/30 |
| | | | 341/143 |
| 2017/0033801 A1* | 2/2017 | Lo .......................... | H03M 3/422 |
| 2019/0173481 A1* | 6/2019 | Ali ......................... | H03M 1/1225 |
| 2019/0260386 A1* | 8/2019 | Raman ................... | H03M 1/48 |

* cited by examiner

SIGMA-DELTA ANALOG-TO-DIGITAL CONVERTER CAPABLE OF REDUCING IDLE TONES WHILE ALTERNATELY CONDUCTING SIGNAL CONVERSION AND COMPARATOR OFFSET CALIBRATION

CROSS-REFERENCE TO RELATED APPLICATIONS

This application claims the benefit of priority to Patent Application No. 108102098, filed in Taiwan on Jan. 18, 2019; the entirety of which is incorporated herein by reference for all purposes.

BACKGROUND

The disclosure generally relates to an analog-to-digital converter (ADC) and, more particularly, to a sigma-delta analog-to-digital converter (sigma-delta ADC) for alternately conducting signal conversion and comparator offset calibration while reducing idle tones at the same time.

A sigma-delta analog-to-digital converter has been widely applied in many applications, but the process deviation of the comparators within the sigma-delta analog-to-digital converter usually causes signal offset. If the comparator offset in the sigma-delta analog-to-digital converter cannot be calibrated, it would cause serious influence on the signal-to-noise ratio (SNR), the total harmonic distortion plus noise (THDN), and other related performance of the sigma-delta analog-to-digital converter.

In addition, the circuit characteristics of the conventional sigma-delta analog-to-digital converter also easily result in idle tones. In the conventional sigma-delta analog-to-digital converter, an additional dither signal generating circuit is typically employed to suppress the generation of idle tones, but this approach inevitably increases the circuit complexity of the sigma-delta analog-to-digital converter.

SUMMARY

An example embodiment of a sigma-delta analog-to-digital converter is disclosed, comprising: a subtractor, arranged to operably subtract a feedback signal from an analog input signal; a loop filter, coupled with the subtractor, and arranged to operably process an output signal of the subtractor to generate a filtered signal; a first signal comparing circuit, coupled with the loop filter and a first reference signal, and arranged to selectively operate in an offset detection mode or a signal comparison mode, wherein the first signal comparing circuit generates a first error signal irrelevant to a relative magnitude between the filtered signal and the first reference signal when operating in the offset detection mode, while the first signal comparing circuit generates a first comparison signal corresponding to a relative magnitude between the filtered signal and the first reference signal when operating in the signal comparison mode; an offset calibration control circuit, coupled with the first signal comparing circuit, and arranged to operably calibrate an offset of the first signal comparing circuit according to the first error signal, and to operably control the first signal comparing circuit to alternately switch between the offset detection mode and the signal comparison mode; and a digital-to-analog converter, coupled with the subtractor and an output terminal of the first signal comparing circuit, and arranged to operably generate the feedback signal according to the first comparison signal.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
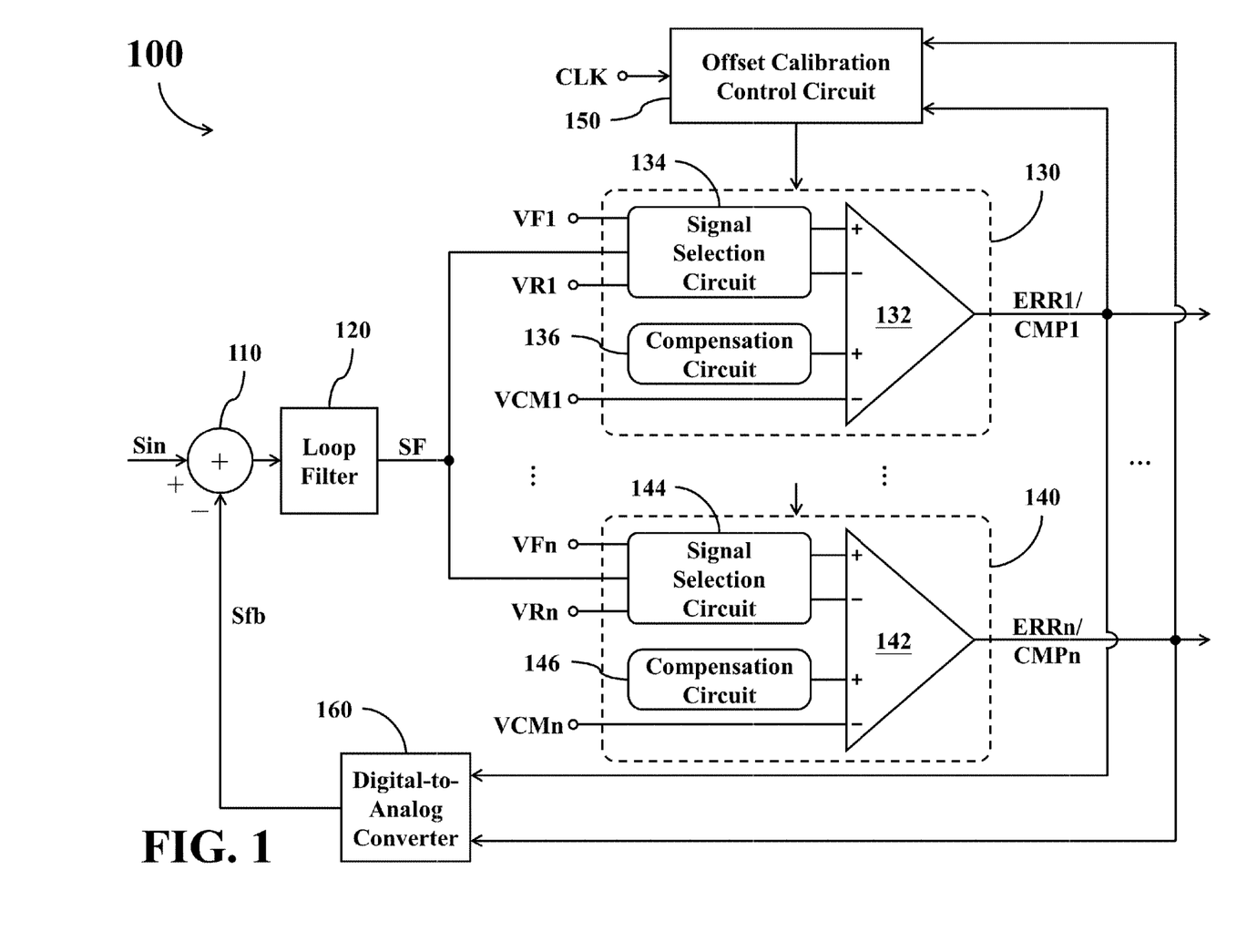
FIG. 1 shows a simplified functional block diagram of a sigma-delta analog-to-digital converter according to a first embodiment of the present disclosure.

FIG. 1 shows a simplified functional block diagram of a sigma-delta analog-to-digital converter 100 according to a first embodiment of the present disclosure. The sigma-delta analog-to-digital converter 100 may be utilized to transfer an analog input signal Sin into a corresponding digital output signal.

As shown in FIG. 1, the sigma-delta analog-to-digital converter 100 comprises a subtractor 110, a loop filter 120, one or more signal comparing circuit (e.g., the exemplary first signal comparing circuit 130 and second signal comparing circuit 140 shown in FIG. 1), an offset calibration control circuit 150, and a digital-to-analog converter 160.

The subtractor 110 is coupled with the analog input signal Sin, and arranged to operably subtract a feedback signal Sfb from the analog input signal Sin.

The loop filter 120 is coupled with the subtractor 110, and arranged to operably process an output signal of the subtractor 110 to generate a filtered signal SF.

The first signal comparing circuit 130 is coupled with the loop filter 120 and a first reference signal VR1, and arranged to selectively operate in an offset detection mode or a signal comparison mode. The first signal comparing circuit 130 generates a first error signal ERR1 irrelevant to the relative magnitude between the filtered signal SF and the first reference signal VR1 when operating in the offset detection mode. The first signal comparing circuit 130 generates a first comparison signal CMP1 corresponding to the relative magnitude between the filtered signal SF and the first reference signal VR1 when operating in the signal comparison mode.

The second signal comparing circuit 140 is coupled with the loop filter 120 and a second reference signal VRn, and arranged to selectively operate in the offset detection mode or the signal comparison mode. The second signal comparing circuit 140 generates a second error signal ERRn irrelevant to the relative magnitude between the filtered signal SF and the second reference signal VRn when operating in the offset detection mode. The second signal comparing circuit 140 generates a second comparison signal CMPn corresponding to the relative magnitude between the filtered signal SF and the second reference signal VRn when operating in the signal comparison mode.

The offset calibration control circuit 150 is coupled with the first signal comparing circuit 130 and the second signal comparing circuit 140, and arranged to operably estimate an offset of the first signal comparing circuit 130 according to the first error signal ERR1, and to operably estimate an offset of the second signal comparing circuit 140 according to the second error signal ERRn. In addition, the offset calibration control circuit 150 is further arranged to operably control the first signal comparing circuit 130 to alternately switch between the offset detection mode and the signal comparison mode, and to operably control the second signal comparing circuit 140 to alternately switch between the offset detection mode and the signal comparison mode.

The digital-to-analog converter 160 is coupled with an output terminal of the first signal comparing circuit 130, an output terminal of the second signal comparing circuit 140, and the subtractor 110. The digital-to-analog converter 160 is arranged to operably generate the aforementioned feedback signal Sfb according to the first comparison signal CMP1 and the second comparison signal CMPn.

In practice, the aforementioned subtractor 110 may be realized with various suitable circuits using operational amplifier structure, or other existing circuits capable of conducting analog signal subtraction operation. The loop filter 120 may be realized with various suitable integration circuits capable of conducting filtering operation. The offset calibration control circuit 150 may be realized with various suitable circuits capable of interpreting digital signals, conducting digital calculations, and generating control signals. The digital-to-analog converter 160 may be realized with various suitable existing digital-to-analog converting circuits.

In addition, all of the signal comparing circuits in the sigma-delta analog-to-digital converter 100 may be designed to have similar circuit structure and operation. For example, in the embodiment of FIG. 1, the first signal comparing circuit 130 comprises a first comparator 132, a first signal selection circuit 134, and a first compensation circuit 136. Similarly, the second signal comparing circuit 140 comprises a second comparator 142, a second signal selection circuit 144, and a second compensation circuit 146.

In the first signal comparing circuit 130, the first comparator 132 comprises four input terminals and is arranged to operably generate an output signal corresponding to signals at the four input terminals. The first signal selection circuit 134 is coupled with the loop filter 120, the first comparator 132, the offset calibration control circuit 150, the first reference signal VR1, and a first fixed-voltage signal VF1, and arranged to selectively switch the signals coupled with the input terminals of the first comparator 132 under control of the offset calibration control circuit 150. The first compensation circuit 136 is coupled with the first comparator 132 and the offset calibration control circuit 150, and arranged to operably conduct signal compensation to at least one of the input terminals of the first comparator 132 under control of the offset calibration control circuit 150. The aforementioned first fixed-voltage signal VF1 may be the common-mode voltage signal of the first comparator 132, or other reference signals having a fixed voltage.

In the second signal comparing circuit 140, the second comparator 142 is arranged to operably compare signals at the input terminals of the second comparator 142 to generate an output signal. The second signal selection circuit 144 is coupled with the loop filter 120, the second comparator 142, the offset calibration control circuit 150, the second reference signal VRn, and a second fixed-voltage signal VFn, and arranged to selectively switch the signals coupled with the input terminals of the second comparator 142 under control of the offset calibration control circuit 150. The second compensation circuit 146 is coupled with the second comparator 142 and the offset calibration control circuit 150, and arranged to operably conduct signal compensation to at least one of the input terminals of the second comparator 142 under control of the offset calibration control circuit 150. The aforementioned second fixed-voltage signal VFn may be the common-mode voltage signal of the second comparator 142, or other reference signals having a fixed voltage.

In practice, the aforementioned first fixed-voltage signal VF1 and second fixed-voltage signal VFn may have the same voltage level, or may have different voltage level.

Figure 2:
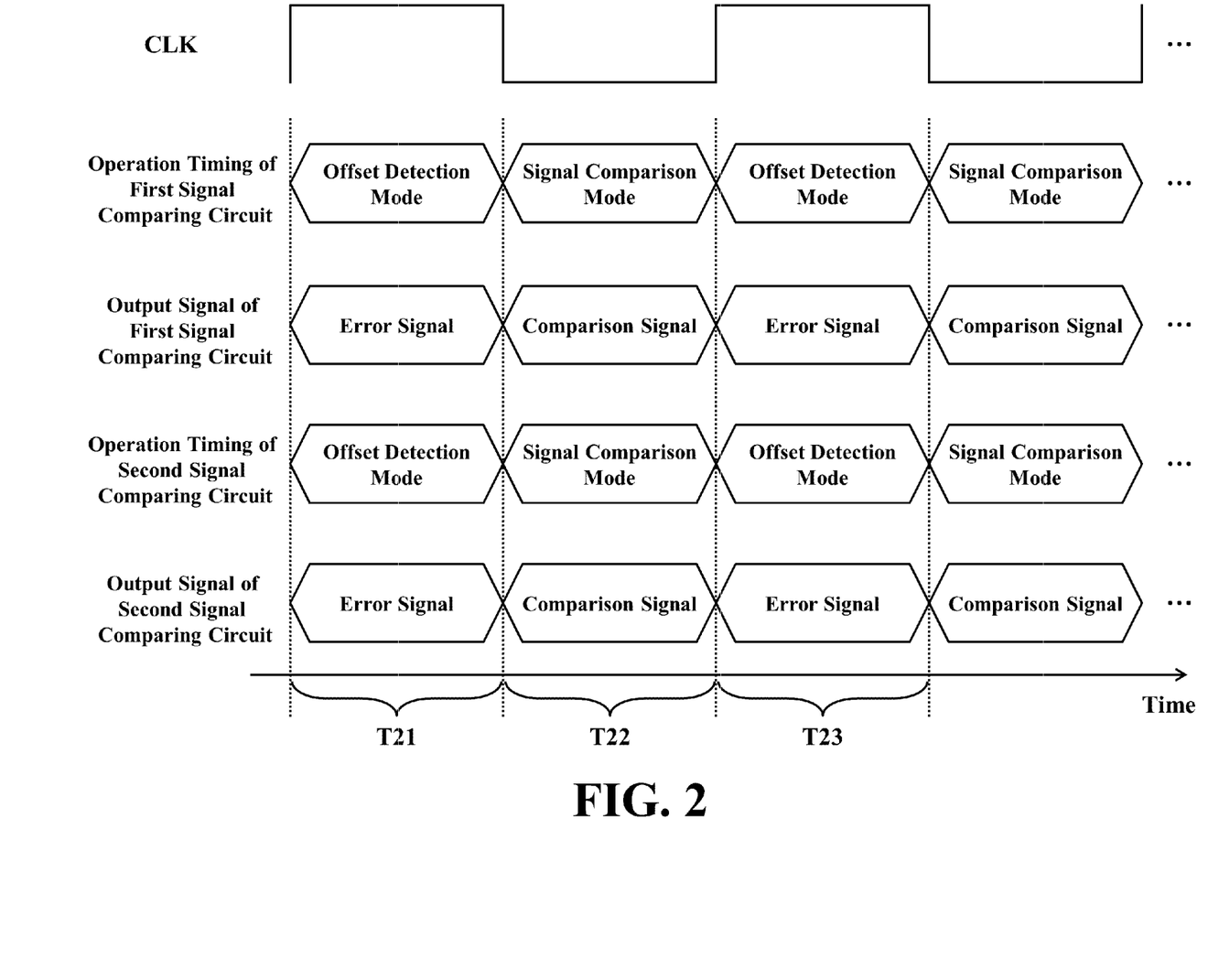
FIG. 2 shows a simplified timing diagram of the sigma-delta analog-to-digital converter in FIG. 1 according to a first embodiment of the present disclosure.

Please refer to FIG. 2, which shows a simplified timing diagram of the sigma-delta analog-to-digital converter 100 in FIG. 1 according to a first embodiment of the present disclosure.

In operations, the offset calibration control circuit 150 may operate based on a working clock CLK. In every predetermined quantity of clock periods of the working clock CLK, the offset calibration control circuit 150 may control each signal selection circuit to switch to the offset detection mode at least one time, and also control each signal selection circuit to switch to the signal comparison mode at least one time. In practice, the aforementioned predetermined quantity may be one, two, three, or other integers.

For example, as shown in FIG. 2, in every clock period of the working clock CLK, the offset calibration control circuit 150 may control the aforementioned first signal comparing circuit 130 and the second signal comparing circuit 140 to synchronously switch to the offset detection mode for a period of time (e.g., the time period T21), then synchronously switch to the signal comparison mode for a period of time (e.g., the time period T22). In this embodiment, both the lengths of the time period T21 and the time period T22 are half of the clock period of the working clock CLK.

In the offset detection mode, the first signal selection circuit 134 couples the input terminals of the first comparator 132 with the first fixed-voltage signal VF1, so that the first comparator 132 generates the aforementioned first error signal ERR1; while the second signal selection circuit 144 couples the input terminals of the second comparator 142 with the second fixed-voltage signal VFn, so that the second comparator 142 generates the aforementioned second error signal ERRn.

In the signal comparison mode, the first signal selection circuit 134 instead respectively couples the input terminals of the first comparator 132 with the filtered signal SF and the first reference signal VR1, so that the first comparator 132 generates the aforementioned first comparison signal CMP1; while the second signal selection circuit 144 instead respectively couples the input terminals of the second comparator 142 with the filtered signal SF and the second reference signal VRn, so that the second comparator 142 generates the aforementioned second comparison signal CMPn.

The offset calibration control circuit 150 may adjust the signal compensation amount of the first compensation circuit 136 according to the first error signal ERR1, so as to calibrate the signal offset of the first comparator 132. Similarly, the offset calibration control circuit 150 may adjust the signal compensation amount of the second compensation circuit 146 according to the second error signal ERRn, so as to calibrate the signal offset of the second comparator 142.

As can be appreciated from the foregoing descriptions, each signal comparing circuit in the aforementioned sigma-delta analog-to-digital converter 100 intermittently compares the filtered signal SF with a corresponding reference signal to achieve the analog-to-digital conversion function of the sigma-delta analog-to-digital converter 100.

On the other hand, each signal comparing circuit in the aforementioned sigma-delta analog-to-digital converter 100 intermittently switches to the offset detection mode, so that the offset calibration control circuit 150 is enabled to determine the signal offset of respective comparators according to the error signals outputted by respective comparators in the offset detection mode, and then to control the aforementioned compensation circuits to calibrate the signal offsets of the corresponding comparators.

The multiple signal comparing circuits in the aforementioned sigma-delta analog-to-digital converter 100 collectively act as a quantizer, and the comparison signals (e.g., the aforementioned first comparison signal CMP1 and the second comparison signal CMPn) generated by these signal comparing circuits collectively form the digital output signal of the sigma-delta analog-to-digital converter 100. The digital output signal can be further processed by a digital processing circuit (not shown in the drawings) in the later stage.

The operations of the aforementioned loop filter 120 together with the subtractor 110 and the digital-to-analog converter 160 in a closed loop may perform a noise shaping on the quantization noise of the sigma-delta analog-to-digital converter 100 to move the quantization noise to a higher frequency band that is not perceivable by human ears, so as to improve the quality of the outputted audio data.

Furthermore, in every clock period of the working clock, the time period during which a signal comparing circuit operates in the offset detection mode is not limited to have the same time length as the time period during which that signal comparing circuit operates in the signal comparison mode. For example, in some embodiments, the time period during which a signal comparing circuit operates in the offset detection mode in every clock periods of the working clock may be adjusted to have a longer time length than the time period during which that same signal comparing circuit operates in the signal comparison mode. For another example, in another embodiments, the time period during which the signal comparison operates in the offset detection mode in every clock periods of the working clock may be adjusted to have a shorter time length than the time period during which that signal comparing circuit operates in the signal comparison mode.

As described previously, all of the signal comparing circuits in the sigma-delta analog-to-digital converter 100 may be designed to have similar circuit structures and operations. The first signal comparing circuit 130 will be taken as an example in the following to further describe the implementations and the operations of each signal comparing circuit by reference to FIG. 3 through FIG. 5.

Figure 3:
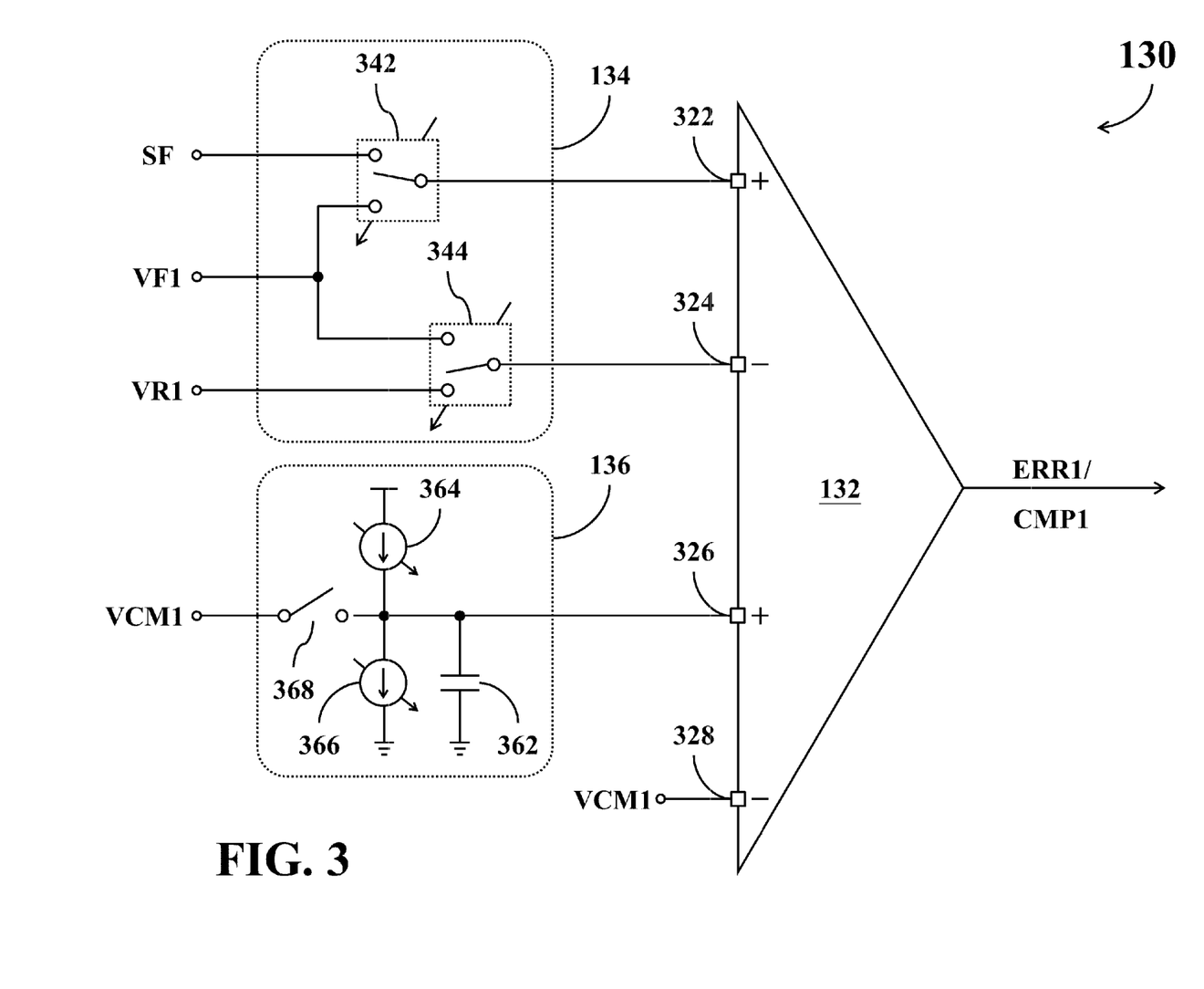
FIG. 3 shows a simplified functional block diagram of a signal comparing circuit in FIG. 1 according to a first embodiment of the present disclosure.
Figure 4:
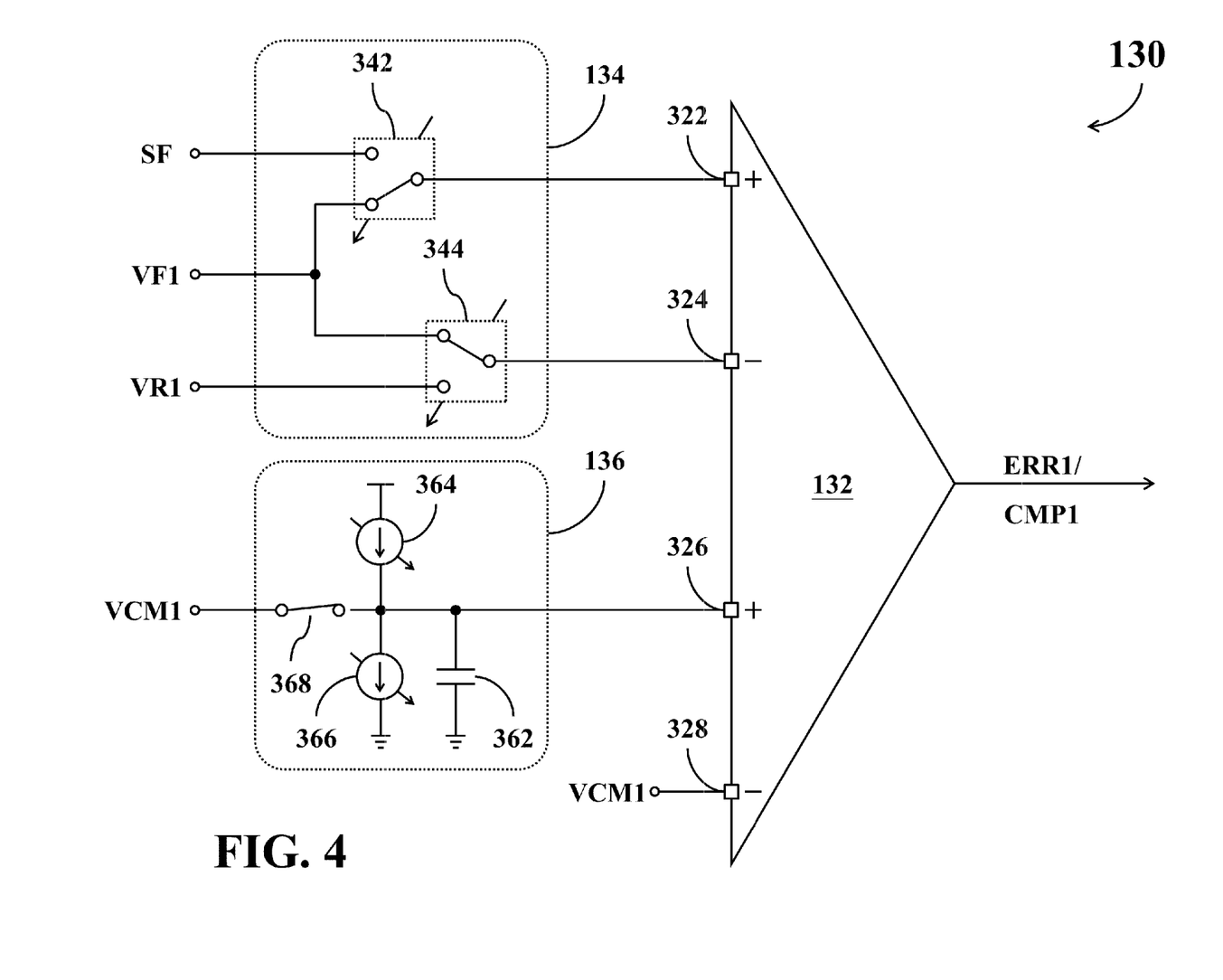
FIGS. 4-6 show simplified schematic diagrams of the operations of the signal comparing circuit in FIG. 2 when it operates in different modes.
Figure 5:
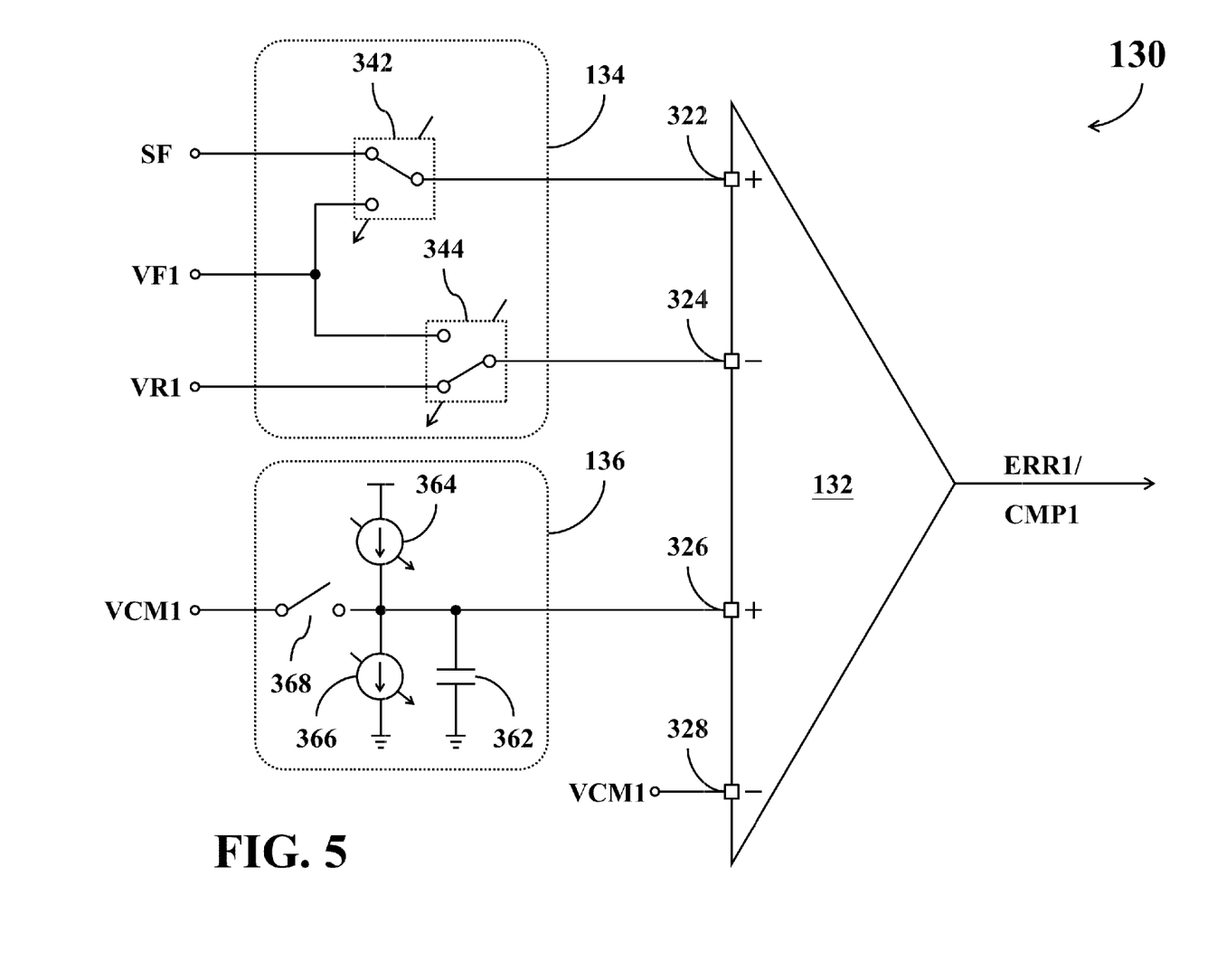

FIG. 3 shows a simplified functional block diagram of the first signal comparing circuit 130 in FIG. 1 according to a first embodiment of the present disclosure. FIG. 4 shows a simplified schematic diagram of the operations of the first signal comparing circuit 130 when it operates in the offset detection mode. FIG. 5 shows a simplified schematic diagram of the operations of the first signal comparing circuit 130 when it operates in the signal comparison mode.

In the embodiment of FIG. 3, the first comparator 132 of the first signal comparing circuit 130 comprises a first input terminal 322, a second input terminal 324, a third input terminal 326, and a fourth input terminal 328. The first signal selection circuit 134 comprises a first switch circuit 342 and a second switch circuit 344. The first compensation circuit 136 comprises a compensation capacitor 362, a first adjusting circuit 364, a second adjusting circuit 366, and a third switch circuit 368.

In the first comparator 132, the first input terminal 322 and the second input terminal 324 are coupled with the first signal selection circuit 134, the third input terminal 326 is coupled with the first compensation circuit 136, while the fourth input terminal 328 is coupled with a first common-mode signal VCM1. The first comparator 132 is arranged to operably compare signals of the first input terminal 322 and the second input terminal 324, and to operably compare signals of the third input terminal 326 and the fourth input terminal 328 at the same time, so as to generate a corresponding output signal. Each input signal of the first comparator 132 may be realized with a single-ended signal or a pair of differential signals. In operations, the signal of the first input terminal 322, the second input terminal 324, the third input terminal 326, and the fourth input terminal 328 simultaneously affect the output signal generated by the first comparator 132. In practice, the first comparator 132 may be realized with various appropriate existing four-input comparators, and the first common-mode signal VCM1 may be realized with a constant voltage signal that can make the first comparator 132 operate properly.

In the first signal selection circuit 134, the first switch circuit 342 is coupled among the loop filter 120, the first fixed-voltage signal VF1, and a first input terminal 322 of the first comparator 132. The first switch circuit 342 is arranged to operably switch the signals to be coupled with the first input terminal 322 under control of the offset calibration control circuit 150. The second switch circuit 344 is coupled among the first reference signal VR1, the first fixed-voltage signal VF1, and a second input terminal 324 of the first comparator 132. The second switch circuit 344 is arranged to operably switch the signals to be coupled with the second input terminal 324 under control of the offset calibration control circuit 150.

In the first compensation circuit 136, the first terminal of the compensation capacitor 362 is coupled with the third input terminal 326, and the second terminal of the compensation capacitor 362 is coupled with a fixed-voltage terminal (e.g., a ground terminal). The first adjusting circuit 364 is coupled with the first terminal of the compensation capacitor 362, and arranged to operably charge the compensation capacitor 362 under control of the offset calibration control circuit 150. The second adjusting circuit 366 is coupled with the first terminal of the compensation capacitor 362, and arranged to operably discharge the compensation capacitor 362 under control of the offset calibration control circuit 150. The third switch circuit 368 is arranged to selectively couple the third input terminal 326 of the first comparator 132 with the aforementioned first common-mode signal VCM1 under control of the offset calibration control circuit 150.

In practice, the aforementioned first comparator 132 may be realized with various appropriate existing four-input comparators. The first common-mode signal VCM1 may be realized with the common mode voltage signal between the third input terminal 326 and the fourth input terminal 328. Each of the first switch circuit 342 and the second switch circuit 344 may be realized with various appropriate transistor combinations. The compensation capacitor 362 may be realized with various appropriate capacitors or parasitic capacitors within the circuits. The third switch circuit 368 may be realized with various appropriate single transistor or transistor combinations. The first adjusting circuit 364 may be realized with an appropriate current source circuit. The second adjusting circuit 366 may be realized with an appropriate current sink circuit.

As shown in FIG. 4, when the sigma-delta analog-to-digital converter 100 begins to operate, the offset calibration control circuit 150 may first configure the first signal comparing circuit 130 to operate in the offset detection mode for a period of time (e.g., in the time period T21). During this time period, the offset calibration control circuit 150 may control the first switch circuit 342 to couple the first input terminal 322 with the first fixed-voltage signal VF1, and control the second switch circuit 344 to couple the second input terminal 324 with the first fixed-voltage signal VF1. In the time period during which the first signal comparing circuit 130 operates in the offset detection mode for the first time, the offset calibration control circuit 150 may further turn on the third switch circuit 368 to couple the third input terminal 326 with the aforementioned first common-mode signal VCM1. Therefore, the first input terminal 322 and the second input terminal 324 of the first comparator 132 would form a short circuit during this time period, while the third input terminal 326 and the fourth input terminal 328 would also form a short circuit during this time period. In this situation, the first comparator 132 compares the signal of the first input terminal 322 with the signal of the second input terminal 324, compares the signal of the third input terminal 326 with the signal of the fourth input terminal 328, and generates a corresponding error signal (i.e., the aforementioned first error signal ERR1) which is irrelevant to the relative magnitude of the filtered signal SF and the first reference signal VR1 according to the aforementioned two comparison results.

In the time period during which the first signal comparing circuit 130 operates in the offset detection mode (e.g., in the time period T21), the offset calibration control circuit 150 controls the first adjusting circuit 364 to charge the compensation capacitor 362 or controls the second adjusting circuit 366 to discharge the compensation capacitor 362 according to the polarity of the first error signal ERR1 generated in the current operation, so as to apply a compensation signal to the third input terminal 326 of the first comparator 132 to thereby calibrate the signal offset of the first comparator 132. In operations, the offset calibration control circuit 150 may configure the charging amount of the first adjusting circuit 364 in each charging operation to be a fixed amount, and/or configure the discharging amount of the second adjusting circuit 366 in each discharging operation to be a fixed amount.

Then, as shown in FIG. 5, the offset calibration control circuit 150 may switch the first signal comparing circuit 130 to the signal comparison mode for a period of time (e.g., the time period T22). During this time period, the offset calibration control circuit 150 may control the first switch circuit 342 to couple the first input terminal 322 with the filtered signal SF, control the second switch circuit 344 to couple the second input terminal 324 with the first reference signal VR1, and turn off the third switch circuit 368. On the other hand, during this time period, the offset calibration control circuit 150 controls the first adjusting circuit 364 and the second adjusting circuit 366 to stop charging/discharging the compensation capacitor 362. In the signal comparison mode, the first comparator 132 compares the filtered signal SF with the first reference signal VR1 to generate a first comparison signal CMP1 corresponding to the relative magnitude of the filtered signal SF and the first reference signal VR1. During this time period, the first compensation circuit 136 may keep conducting compensation to the signal of the third input terminal 326, so that the polarity of the first comparison signal CMP1 generated by the first comparator 132 reflects the signal offset of the first comparator 132 in the case of that the compensation signal is applied to the third input terminal 326 to a certain extent.

Figure 6:
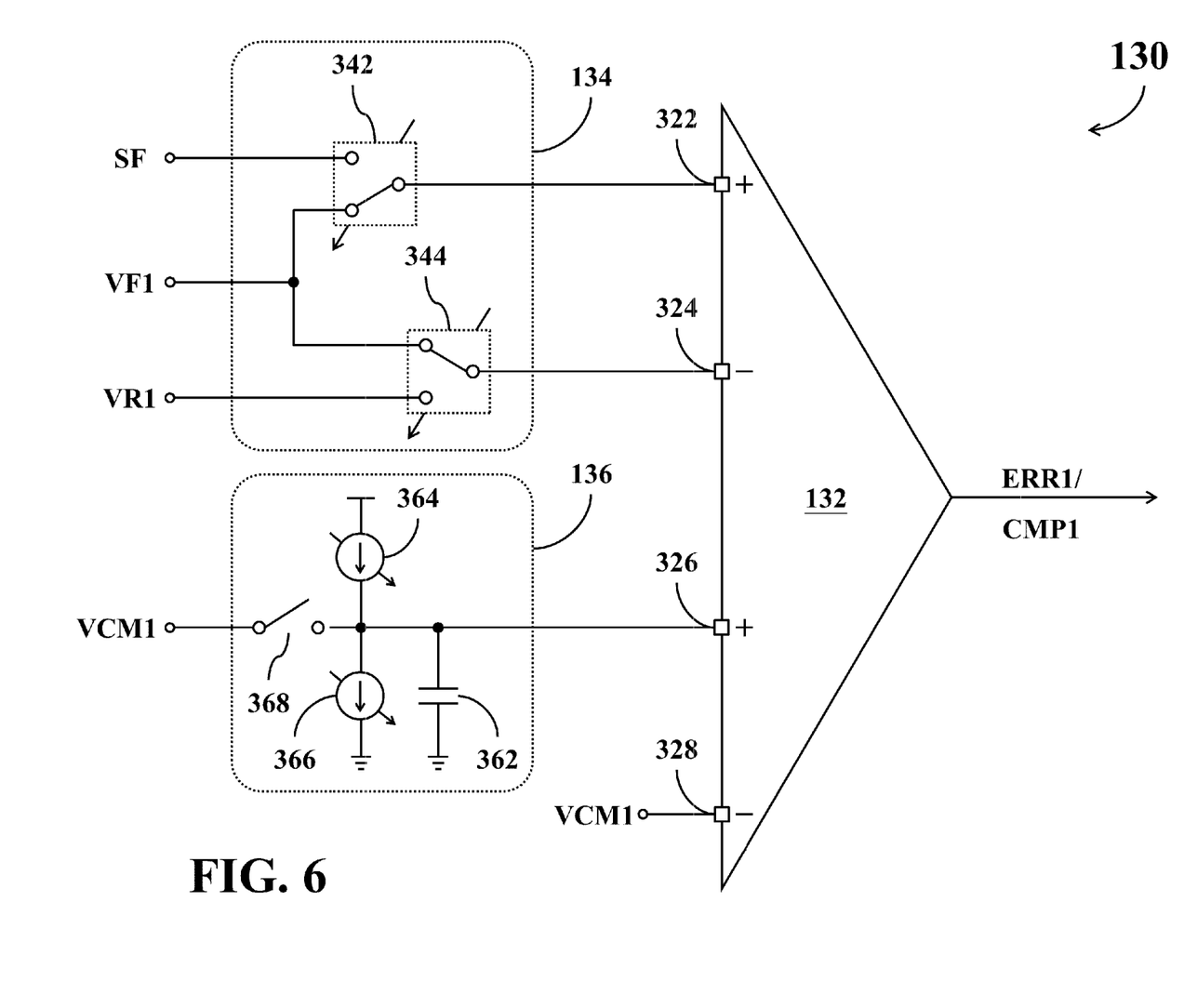

Afterwards, as shown in FIG. 6, the offset calibration control circuit 150 may switch the first signal comparing circuit 130 to the offset detection mode for a period of time (e.g., the time period T23). During this time period, the offset calibration control circuit 150 controls the first signal selection circuit 134 and the first compensation circuit 136 with the same approach as the first signal comparing circuit 130 was configured to operate in the offset detection mode at the first time. The difference is that at the first time the offset calibration control circuit 150 configures the first signal comparing circuit 130 to operate in the offset detection mode, the offset calibration control circuit 150 turns on the third switch circuit 368, but after that, the offset calibration control circuit 150 would turn off the third switch circuit 368 at each time the offset calibration control circuit 150 switches the first signal comparing circuit 130 to the offset detection mode. In other words, during the time period T23 and subsequent time periods of offset detection mode, the third switch circuit 368 is turned off instead.

During the time period T23, the first input terminal 322 and the second input terminal 324 of the first comparator 132 form a short circuit, but the third input terminal 326 and the fourth input terminal 328 do not form a short circuit. During this time period, the first compensation circuit 136 keeps conducting signal compensation to the third input terminal 326.

Accordingly, during the time period T23, the first comparator 132 compares the signal of the first input terminal 322 with the signal of the second input terminal 324, compares the signal of the third input terminal 326 with the signal of the fourth input terminal 328, and generates the first error signal ERR1 according to the aforementioned two comparison results, which is irrelevant to the relative magnitude of the filtered signal SF and the first reference signal VR1.

The offset calibration control circuit 150 decides the compensation direction for each time period during which the first signal comparing circuit 130 operating in the offset detection mode by detecting the polarity of the first error signal ERR1 being currently outputted from the first signal comparing circuit 130 at that time. For example, if the polarity of the first error signal ERR1 being currently generated by the first signal comparing circuit 130 operating in the offset detection mode is negative, then the offset calibration control circuit 150 controls the first adjusting circuit 364 to charge the compensation capacitor 362; if the polarity of the first error signal ERR1 being currently generated by the first signal comparing circuit 130 operating in the current offset detection mode is positive, then the offset calibration control circuit 150 controls the second adjusting circuit 366 to discharge the compensation capacitor 362. In this way, the offset calibration control circuit 150 adjusts the signal compensation amount applied to the third input terminal 326 of the first comparator 132 to thereby calibrate the signal offset of the first comparator 132.

Then, in the subsequent signal processing time period during which the sigma-delta analog-to-digital converter 100 conducts the analog-to-digital conversion, the offset calibration control circuit 150 may repeatedly conduct the aforementioned operations that had been performed in the time period T22 and the time period T23 to intermittently detect and dynamically calibrate the signal offset of the first comparator 132 in the first signal comparing circuit 130.

Similarly, the offset calibration control circuit 150 may adopt the aforementioned method to intermittently detect the signal offset of the second comparator 142 in the second signal comparing circuit 140, and to dynamically control the second compensation circuit 146 to apply a compensation signal to the input terminal of the second comparator 142, so as to calibrate the signal offset of the second comparator 142.

As can be appreciated from the foregoing descriptions, the offset calibration control circuit 150 intermittently detects the signal offset of the comparator in respective signal comparing circuits and dynamically controls respective compensation circuits to apply compensation signals to the input terminals of the corresponding comparators, so as to calibrate the signal offsets of the comparators in the sigma-delta analog-to-digital converter 100.

Since different comparators have different signal offsets, it is highly likely that the compensation signal amount being currently applied to the input terminal of the first comparator 132 by the first compensation circuit 136 may be different from the compensation signal amount being currently applied to the input terminal of the second comparator 142 by the second compensation circuit 146 at any time point.

On the other hand, the offset calibration control circuit 150 adjusts the compensation circuit in the signal comparing circuit every time the signal comparing circuit operates in the offset detection mode, and the direction of the current adjustment may be the same as or different from the direction of the previous adjustment. Therefore, the amount of the input signal compensation received by a comparator is not fixed, but constantly changes over time with slight variation, and the variation pattern of the amount of the input signal compensation is similar to noise.

For example, the aforementioned operation of applying the compensation signal to the input terminal of the first comparator 132 conducted by the first compensation circuit 136 is, to a certain extent, equivalent to applying a noise-like dithering signal to the input terminal of the first comparator 132.

For another example, the aforementioned operation of applying the compensation signal to the input terminal of the second comparator 142 conducted by the second compensation circuit 146 is, to a certain extent, equivalent to applying a noise-like dithering signal to the input terminal of the second comparator 142.

Therefore, there is no need to couple any conventional dithering signal generating circuit to the aforementioned sigma-delta analog-to-digital converter 100, thereby effectively preventing sigma-delta analog-to-digital converter 100 from outputting idle tones or reducing the possibility that sigma-delta analog-to-digital converter 100 outputs idle tones without any extra hardware.

In the aforementioned embodiments, the offset calibration control circuit 150 synchronously switches the first signal comparing circuit 130 and the second signal comparing circuit 140 to the offset detection mode, and also synchronously switches the first signal comparing circuit 130 and the second signal comparing circuit 140 to the signal comparison mode. This is merely an exemplary operation, rather than a restriction to practical implementations of the present disclosure.

Figure 7:
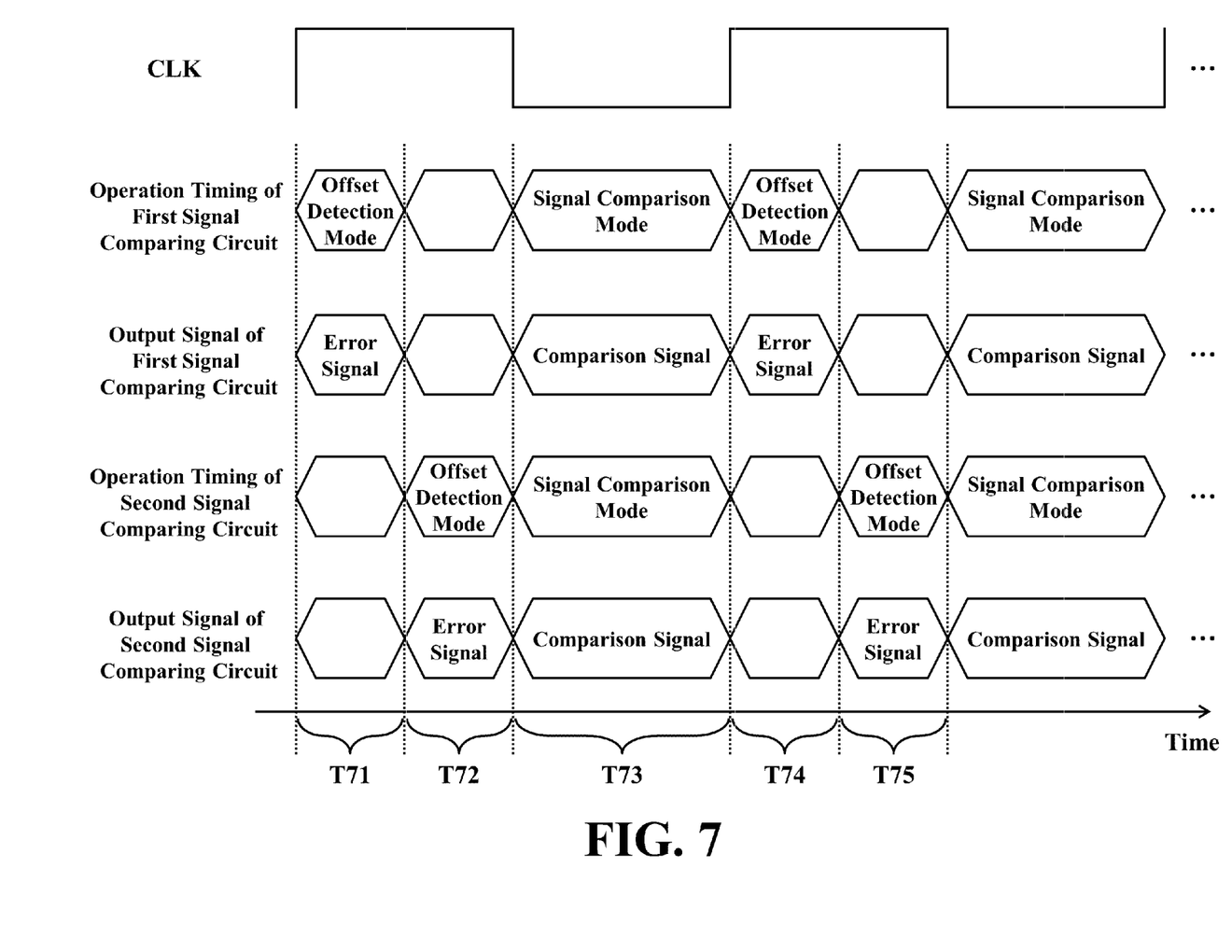
FIG. 7 shows a simplified timing diagram of the sigma-delta analog-to-digital converter in FIG. 1 according to a second embodiment of the present disclosure.

For example, FIG. 7 shows a simplified timing diagram of the sigma-delta analog-to-digital converter 100 in FIG. 1 according to a second embodiment of the present disclosure.

In the embodiment of FIG. 7, the offset calibration control circuit 150 controls all of the signal comparing circuits to synchronously operate in the signal comparison mode during the same time period, but configures different signal comparing circuits to operate in the offset detection mode in different time periods. For example, as shown in FIG. 7, the offset calibration control circuit 150 may configure the first signal comparing circuit 130 to operate in the offset detection mode in the time period T71, and may configure the second signal comparing circuit 140 to operate in the offset detection mode in the time period T72 after the time period T71. Then, the offset calibration control circuit 150 controls all of the signal comparing circuits to operate in the signal comparison mode in the time period T73. In another embodiment, the offset calibration control circuit 150 may configure the first signal comparing circuit 130 to operate in the offset detection mode in the time period T71, then control all of the signal comparing circuits to operate in the signal comparison mode in the time period T73, and then configure the second signal comparing circuit 140 to operate in the offset detection mode in the time period T74 within the next clock period of the working clock CLK.

Afterwards, the offset calibration control circuit 150 may configure the first signal comparing circuit 130 to operate in the offset detection mode in the time period T74, and then configure the second signal comparing circuit 140 to operate in the offset detection mode in the time period T75 after the time period T74.

In other words, the first signal comparing circuit 130 and the second signal comparing circuit 140 may be switched to the offset detection mode in different time periods, and may stay in the offset detection mode for different time lengths. Such operation can reduce the computing loading of the offset calibration control circuit 150 during the same time period and lower the demand with respect to the computing ability of the offset calibration control circuit 150, and thus the offset calibration control circuit 150 may be realized with simpler circuit structures.

In addition, in the aforementioned embodiment, the first compensation circuit 136 comprises the compensation capacitor 362, the first adjusting circuit 364, the second adjusting circuit 366, and the third switch circuit 368. This is merely an exemplary structure, rather than a restriction to practical implementations of the present disclosure.

Figure 8:
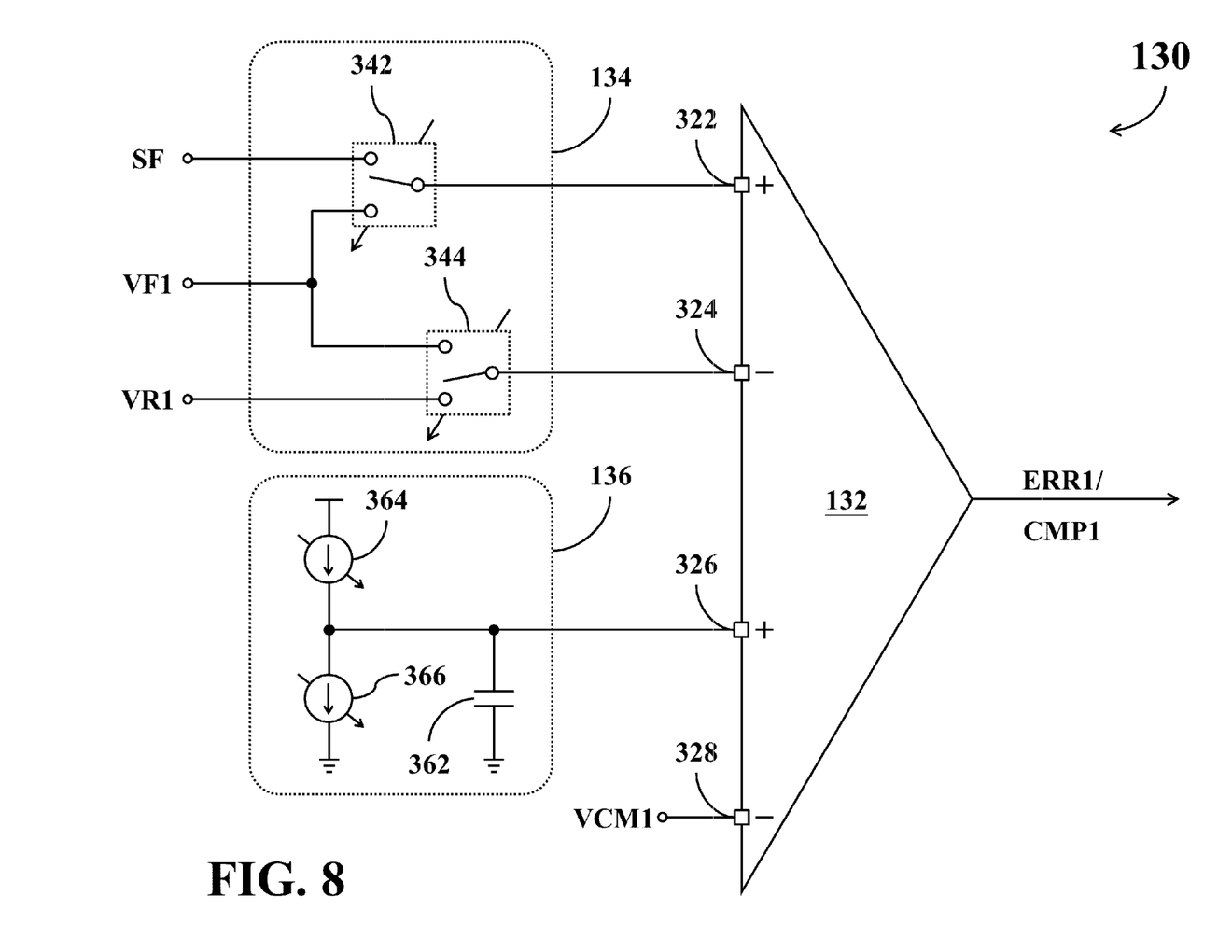
FIG. 8 shows a simplified functional block diagram of the signal comparing circuit in FIG. 1 according to a second embodiment of the present disclosure.

For example, FIG. 8 shows a simplified functional block diagram of the first signal comparing circuit 130 in FIG. 1 according to a second embodiment of the present disclosure. In the embodiment of FIG. 8, the aforementioned third switch circuit 368 in the first compensation circuit 136 is omitted.

In this situation, at the first time the offset calibration control circuit 150 configures the first signal comparing circuit 130 to operate in the offset detection mode, the offset calibration control circuit 150 may control the first adjusting circuit 364 to charge the compensation capacitor 362, or control the second adjusting circuit 366 to discharge the compensation capacitor 362, so as to apply a predetermined amount of signal compensation to the third input terminal 326 of the first comparator 132. The signal offset of the first comparator 132 in the first signal comparing circuit 130 can be effectively calibrated by repeatedly conducting the aforementioned operations that had been performed in the time period T22 and the time period T23, but it may take a little bit longer time to reach the steady state than that in the embodiment of FIG. 3.

Figure 9:
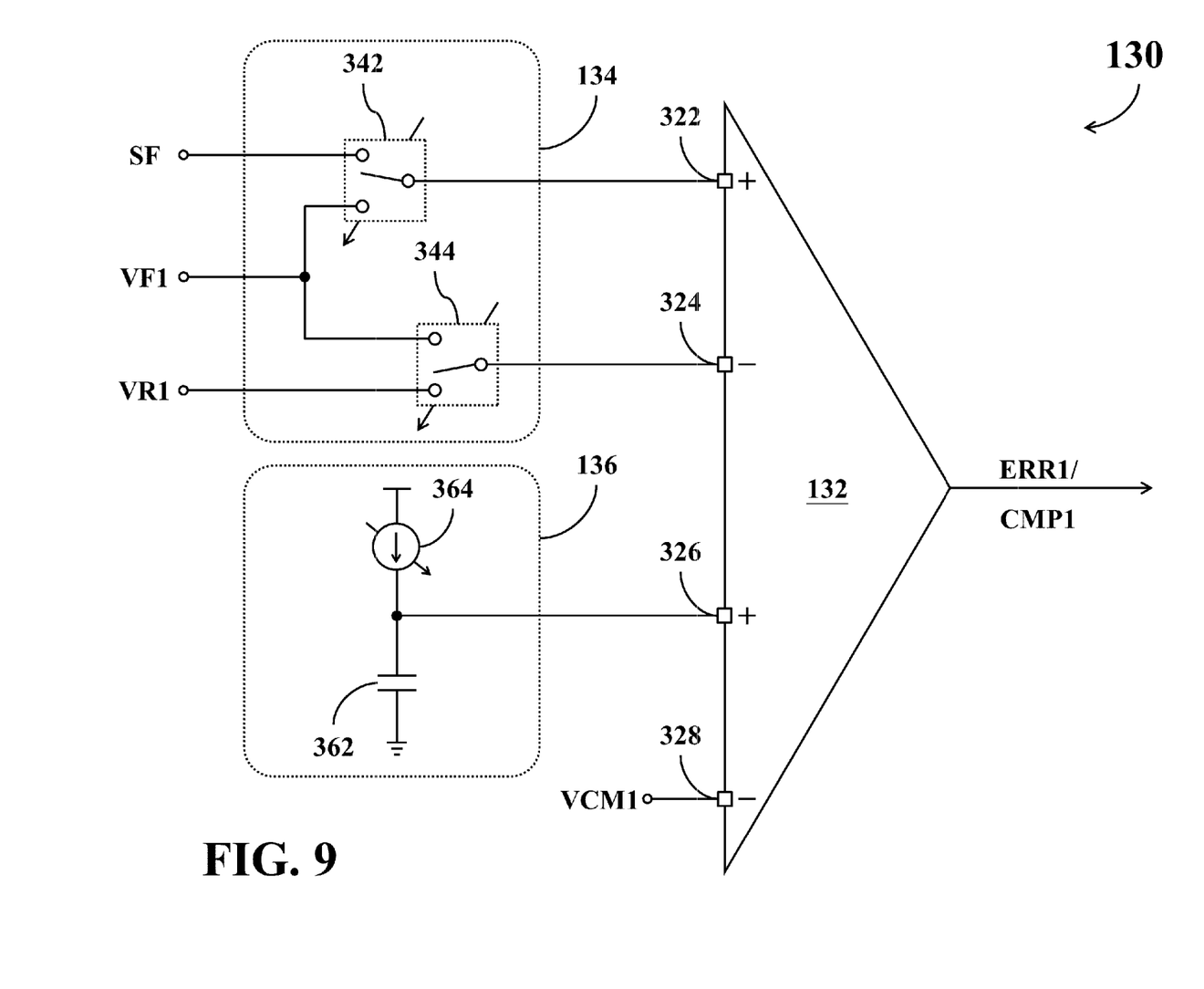
FIG. 9 shows a simplified functional block diagram of the signal comparing circuit in FIG. 1 according to a third embodiment of the present disclosure.

For another example, FIG. 9 shows a simplified functional block diagram of the first signal comparing circuit 130 in FIG. 1 according to a third embodiment of the present disclosure. In the embodiment of FIG. 9, the aforementioned second adjusting circuit 366 and the third switch circuit 368 in the first compensation circuit 136 are omitted.

In this situation, at the first time the offset calibration control circuit 150 configures the first signal comparing circuit 130 to operate in the offset detection mode, the offset calibration control circuit 150 may control the first adjusting circuit 364 to charge the compensation capacitor 362, so as to apply a predetermined amount of signal compensation to the third input terminal 326 of the first comparator 132. The signal offset of the first comparator 132 in the first signal comparing circuit 130 can be calibrated by repeatedly conducting the aforementioned operations that had been performed in the time period T22 and the time period T23, but it may take a little bit longer time to reach the steady state than that in the embodiment of FIG. 8.

Please note that the quantity of the signal comparing circuits employed in the sigma-delta analog-to-digital converter 100 is not restricted to the quantity shown in the aforementioned embodiments. In practice, the quantity of the signal comparing circuits employed in the sigma-delta analog-to-digital converter 100 may be increased according to the circuit requirements. In some embodiments, the quantity of the signal comparing circuits employed in the sigma-delta analog-to-digital converter 100 may be reduced to only one to simplify the overall circuit structure.

Moreover, the quantity of the input terminals of each comparator (e.g., the aforementioned first comparator 132 and the second comparator 142) in respective signal comparing circuits may be increased according to the circuit requirement, and is not restricted to four as shown in the aforementioned embodiments.

In some embodiments, the aforementioned fourth input terminal 328 of the first comparator 132 may be additionally coupled with an extra group of compensation circuits which has the same structure as the first compensation circuit 136 but has a compensation direction opposite to the compensation direction of the first compensation circuit 136. In some embodiments, the aforementioned first compensation circuit 136 may instead be coupled with the fourth input terminal 328 of the first comparator 132. In some embodiments, the third input terminal 326 and the fourth input terminal 328 of the first comparator 132 may instead be coupled with a switched-capacitor circuit capable of providing a signal compensation function similar to the first compensation circuit 136. Similarly, the compensation circuit coupled with the input terminal of the comparator in other signal comparing circuits may be modified according to the aforementioned variation.

It can be appreciated from the foregoing descriptions that the offset calibration control circuit 150 can effectively calibrate the signal offset of the respective signal comparing circuits in the sigma-delta analog-to-digital converter 100, thereby improving the overall performance of the sigma-delta analog-to-digital converter 100.

In addition, the operation of controlling the aforementioned compensation circuits to apply compensation signals to the input terminals of related comparators conducted by the offset calibration control circuit 150 happens to be equivalent to applying noise-like dithering signals to the input terminals of the comparators. Accordingly, the above operation of the offset calibration control circuit 150 can also effectively prevent the sigma-delta analog-to-digital converter 100 from outputting idle tones or reduce the possibility that the comparators in the sigma-delta analog-to-digital converter 100 outputs idle tones. Therefore, there is no need to utilize any additional dither signal generating circuit in the sigma-delta analog-to-digital converter 100, and thus the circuit complexity of the sigma-delta analog-to-digital converter 100 can be reduced.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

The term "voltage signal" used throughout the description and the claims may be expressed in the format of a current in implementations, and the term "current signal" used throughout the description and the claims may be expressed in the format of a voltage in implementations.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A sigma-delta analog-to-digital converter (100), comprising:
 a subtractor (110), arranged to operably subtract a feedback signal (Sfb) from an analog input signal (Sin);
 a loop filter (120), coupled with the subtractor (110), and arranged to operably process an output signal of the subtractor (110) to generate a filtered signal (SF);
 a first signal comparing circuit (130), coupled with the loop filter (120) and a first reference signal (VR1), and arranged to selectively operate in an offset detection mode or a signal comparison mode, wherein the first signal comparing circuit (130) generates a first error signal (ERR1) irrelevant to a relative magnitude between the filtered signal (SF) and the first reference signal (VR1) when operating in the offset detection mode, while the first signal comparing circuit (130) generates a first comparison signal (CMP1) corresponding to a relative magnitude between the filtered signal (SF) and the first reference signal (VR1) when operating in the signal comparison mode;
 an offset calibration control circuit (150), coupled with the first signal comparing circuit (130), and arranged to operably calibrate an offset of the first signal comparing circuit (130) according to the first error signal (ERR1), and to operably control the first signal comparing circuit (130) to alternately switch between the offset detection mode and the signal comparison mode; and a digital-to-analog converter (160), coupled with the subtractor (110) and an output terminal of the first signal comparing circuit (130), and arranged to operably generate the feedback signal (Sfb) according to the first comparison signal (CMP1);

wherein the first signal comparing circuit (130) comprises:

a first comparator (132), having a first input terminal (322), a second input terminal (324), a third input terminal (326), and a fourth input terminal (328), and arranged to operably compare signals of the first input terminal (322) and the second input terminal (324), and compare signals of the third input terminal (326) and the fourth input terminal (328), so as to generate a corresponding output signal, wherein the fourth input terminal (328) is coupled with a first common-mode signal (VCM1), and a first signal selection circuit (134), coupled with the loop filter (120), the first input terminal (322) of the first comparator (132), the second input terminal (324) of the first comparator (132), the offset calibration control circuit (150), the first reference signal (VR1), and a first fixed-voltage signal (VF1), wherein in the offset detection mode, the first signal selection circuit (134) couples both the first input terminal (322) and the second input terminal (324) with the first fixed-voltage signal (VF1), so that the first comparator (132) generates the first error signal (ERR1), while in the signal comparison mode, the first signal selection circuit (134) respectively couples the first input terminal (322) and the second input terminal (324) with the filtered signal (SF) and the first reference signal (VR1), so that the first comparator (132) generates the first comparison signal (CMP1).

2. The sigma-delta analog-to-digital converter (100) of claim 1, wherein the first signal comparing circuit (130) further comprises:

a first compensation circuit (136), coupled with the offset calibration control circuit (150) and the third input terminal (326) of the first comparator (132), and arranged to operably compensate the signal of the third input terminal (326) of the first comparator (132) under control of the offset calibration control circuit (150);

wherein in every predetermined number of clock periods of a clock (CLK), the offset calibration control circuit (150) is further arranged to operably control the first signal selection circuit (134) to switch to the offset detection mode at least one time, and to switch to the signal comparison mode at least one time; and the offset calibration control circuit (150) is further arranged to operably adjust a signal compensation amount with respect to the first compensation circuit (136) according to the first error signal (ERR1).

3. The sigma-delta analog-to-digital converter (100) of claim 2, wherein the first signal selection circuit (134) comprises:

a first switch circuit (342), coupled among the loop filter (120), the first fixed-voltage signal (VF1), and the first input terminal (322), and controlled by the offset calibration control circuit (150); and a second switch circuit (344), coupled among the first reference signal (VR1), the first fixed-voltage signal (VF1), and the second input terminal (324), and controlled by the offset calibration control circuit (150);

wherein in the offset detection mode, the offset calibration control circuit (150) controls the first switch circuit (342) to couple the first input terminal (322) with the first fixed-voltage signal (VF1), and controls the second switch circuit (344) to couple the second input terminal (324) with the first fixed-voltage signal (VF1); while in the signal comparison mode, the offset calibration control circuit (150) controls the first switch circuit (342) to couple the first input terminal (322) with the filtered signal (SF), and controls the second switch circuit (344) to couple the second input terminal (324) with the first reference signal (VR1).

4. The sigma-delta analog-to-digital converter (100) of claim 3, wherein the first compensation circuit (136) comprises:

a compensation capacitor (362), wherein a first terminal of the compensation capacitor (362) is coupled with the third input terminal (326), while a second terminal of the compensation capacitor (362) is coupled with a fixed-voltage terminal; and a first adjusting circuit (364), coupled with the first terminal of the compensation capacitor (362), and arranged to operably charge the compensation capacitor (362) under control of the offset calibration control circuit (150).

5. The sigma-delta analog-to-digital converter (100) of claim 4, wherein the first compensation circuit (136) further comprises:

a second adjusting circuit (366), coupled with the first terminal of the compensation capacitor (362), and arranged to operably discharge the compensation capacitor (362) under control of the offset calibration control circuit (150).

6. The sigma-delta analog-to-digital converter (100) of claim 5, wherein the first compensation circuit (136) further comprises:

a third switch circuit (368), arranged to selectively couple the third input terminal (326) of the first comparator (132) with the first common-mode signal (VCM1) under control of the offset calibration control circuit (150).

7. The sigma-delta analog-to-digital converter (100) of claim 4, wherein the first compensation circuit (136) further comprises:

a third switch circuit (368), arranged to selectively couple the third input terminal (326) of the first comparator (132) with the first common-mode signal (VCM1) under control of the offset calibration control circuit (150).

8. The sigma-delta analog-to-digital converter (100) of claim 2, further comprising:

a second signal comparing circuit (140), coupled with the loop filter (120), the offset calibration control circuit (150), the digital-to-analog converter (160), and a second reference signal (VRn), and arranged to selectively operate in the offset detection mode or the signal comparison mode, wherein when operating in the offset detection mode, the second signal comparing circuit (140) generates a second error signal (ERRn) irrelevant to the filtered signal (SF) and the second reference signal (VRn); while when operating in the signal comparison mode, the second signal comparing circuit (140) generates a second comparison signal (CMPn)

corresponding to a relative magnitude between the filtered signal (SF) and the second reference signal (VRn);

wherein the offset calibration control circuit (150) is further arranged to operably calibrate an offset of the second signal comparing circuit (140) according to the second error signal (ERRn), and to operably control the second signal comparing circuit (140) to alternately switch between the offset detection mode and the signal comparison mode; and the digital-to-analog converter (160) is further arranged to operably generate the feedback signal (Sfb) according to the second comparison signal (CMPn).

9. The sigma-delta analog-to-digital converter (100) of claim 2, wherein no dither signal generating circuit is coupled in a signal path between the first comparator (132) and the loop filter (120).

10. The sigma-delta analog-to-digital converter (100) of claim 2, wherein no dither signal generating circuit is coupled with any of the first input terminal (322), the second input terminal (324), the third input terminal (326), and the fourth input terminal (328) of the first comparator (132).

* * * * *